(12) United States Patent
Yamashita et al.

(10) Patent No.: US 7,892,862 B2
(45) Date of Patent: Feb. 22, 2011

(54) METHOD OF EVALUATING THERMAL TREATMENT AND METHOD OF MANUFACTURING SEMICONDUCTOR WAFER

(75) Inventors: Takafumi Yamashita, Chiba (JP); Mohammad B. Shabani, Chiba (JP)

(73) Assignee: Sumco Corporation, Tokyo (JP)

( * ) Notice: Subject to any disclaimer, the term of this patent is extended or adjusted under 35 U.S.C. 154(b) by 325 days.

(21) Appl. No.: 11/695,699

(22) Filed: Apr. 3, 2007

(65) Prior Publication Data
US 2008/0020496 A1 Jan. 24, 2008

(30) Foreign Application Priority Data
Apr. 5, 2006 (JP) .............................. 2006-103845

(51) Int. Cl.
*G01L 31/26* (2006.01)
(52) U.S. Cl. ................................. 438/14; 257/E21.001
(58) Field of Classification Search .................... 257/48
See application file for complete search history.

(56) References Cited
U.S. PATENT DOCUMENTS

| | | | | |
|---|---|---|---|---|
| 4,420,722 A | * | 12/1983 | Todd | 324/767 |
| 5,350,489 A | * | 9/1994 | Muraoka | 216/83 |
| 5,374,396 A | * | 12/1994 | Blackford et al. | 422/73 |
| 5,458,735 A | * | 10/1995 | Richter et al. | 438/22 |
| 5,705,423 A | * | 1/1998 | Sakata et al. | 148/33.4 |
| 6,348,261 B1 | * | 2/2002 | Murakami | 428/332 |
| 2002/0151252 A1 | * | 10/2002 | Kawase et al. | 451/36 |

FOREIGN PATENT DOCUMENTS

JP 10-223713 8/1998

OTHER PUBLICATIONS

English language Abstract of JP 10-223713.

* cited by examiner

*Primary Examiner*—Thanh V Pham
*Assistant Examiner*—Mark A Laurenzi, III
(74) *Attorney, Agent, or Firm*—Greenblum & Bernstein, P.L.C.

(57) ABSTRACT

Provided are the methods of evaluating thermal treatment. In the methods, a wafer comprising a silicon substrate having an oxygen concentration of approximately equal to or less than $1.0 \times 10^{18}$ atoms/cm$^3$ and a silicon epitaxial layer on at least one surface of the substrate is employed.

11 Claims, 2 Drawing Sheets

METHOD OF EVALUATING THERMAL TREATMENT AND METHOD OF MANUFACTURING SEMICONDUCTOR WAFER

CROSS-REFERENCE TO RELATED APPLICATIONS

This application claims benefit of priority under 35 USC 119 to Japanese Patent Application No. 2006-103845 filed on Apr. 5, 2006, which is expressly incorporated herein by reference in its entirety.

BACKGROUND OF THE INVENTION

1. Field of the Invention

The present invention relates to a method of evaluating thermal treatment that is capable of conveniently evaluating with high precision the metal contamination from a thermal treatment process in the process of manufacturing a semiconductor wafer; and a method of manufacturing a semiconductor wafer capable of providing a semiconductor wafer with less contamination by metals from a thermal treatment process.

2. Discussion of the Background

Impurities in semiconductor wafers can compromise device characteristics and greatly affect device manufacturing yields. Among such impurities, metal impurities readily diffuse into the interior of wafers during various thermal treatment processes such as oxidation, diffusion, and epitaxial growth during the process of manufacturing a wafer. They can potentially cause deposits, dislocation, oxidation-induced stacking faults (OSF), and other crystal defects; shorten the minority carrier lifetime; increase current leaks; and reduce the breakdown voltage of oxide films, and the like. Thus, to decrease metal contamination in thermal treatment processes, prior to thermally treating the actual product, a wafer for evaluating the level of process contamination of the heating furnace being employed can be used for test evaluation. Once contamination has been reduced based on the evaluation value, the actual product is thermally treated. Evaluation wafers are also sometimes introduced into heating furnaces as part of daily management in evaluation and control.

Conventionally, the surface Photo Voltage (SPV) method and lifetime method have been employed to evaluate the metal contamination of such evaluation wafers. However, although these methods can permit convenient evaluation, the only metal that can be quantitatively evaluated is iron. Metal impurities such as nickel and copper that can also negatively affect semiconductor wafer characteristics cannot be efficiently quantified by the SPV method.

Accordingly, the present inventors proposed a wafer for evaluating thermal treatment processes in which a gettering layer trapping metal impurities is provided on a prescribed silicon wafer (see Japanese Unexamined Patent Publication (KOKAI) Heisei No. 10-223713, which is expressly incorporated herein by reference in its entirety) as a wafer for evaluating metal contamination such as copper and nickel in thermal treatment processes.

The wafer described in Japanese Unexamined Patent Publication (KOKAI) Heisei No. 10-223713 permits the highly sensitive evaluation of metal impurities that are difficult to evaluate by the conventional SPV and lifetime methods, and the like. However, since the above-cited method traps metal impurities in a layer, it becomes necessary to dissolve the gettering layer and an $SiO_2$ layer to analyze the metal impurities.

SUMMARY OF THE INVENTION

A feature of the present invention provides for conveniently evaluating contamination with high sensitivity in thermal treatment processes.

A feature of the present invention relates to a method of evaluating thermal treatment of a wafer, including conducting a test thermal treatment in which a wafer comprising a silicon substrate having an oxygen concentration of approximately equal to or less than $1.0 \times 10^{18}$, atoms/cm$^3$ and a silicon epitaxial layer on at least one surface of the substrate, is heated under the condition of thermal treatment to be evaluated and subsequently cooled; and collecting and analyzing metal components on a surface of the silicon epitaxial layer following the test thermal treatment.

In one embodiment, an oxide film is formed on the surface of the silicon epitaxial layer, and the collection of metal components is conducted after removing the oxide film from the surface of the silicon epitaxial layer.

In one embodiment, the collection of metal components is performed with a mixed aqueous solution of hydrofluoric acid, hydrogen peroxide and water.

In one embodiment, the silicon epitaxial wafer has a thickness ranging from approximately 1 to approximately 10 micrometers.

In one embodiment, the silicon substrate has a resistivity ranging from approximately 4 to approximately 20 ohms·cm.

In one embodiment, the silicon epitaxial layer has a resistivity ranging from approximately 6 to approximately 10 ohms·cm.

In one embodiment, wherein the silicon substrate has a resistivity higher than that of the silicon epitaxial layer.

In one embodiment, boron is doped in the silicon substrate and the silicon epitaxial layer.

In one embodiment, the silicon substrate has a surface that has been mirror-polished and has the silicon epitaxial layer on the mirror-polished surface.

In one embodiment, the evaluation includes the evaluating of presence and/or quantity of metal contamination during thermal treatment in the process of manufacturing a semiconductor wafer.

In one embodiment, the metal being evaluated is copper and/or nickel.

A feature of the present invention further relates to a method of evaluating thermal treatment of a wafer, including conducting a test thermal treatment in which a wafer comprising a silicon substrate having an oxygen concentration of approximately equal to or less than $1.0 \times 10^{18}$ atoms/cm$^3$, and a silicon epitaxial layer on at least one surface of the substrate is heated under the condition of thermal treatment to be evaluated and subsequently cooled; removing an oxide film that has been formed during the test thermal treatment; following the removing of the oxide film the wafer remains stationary in a standing period for a prescribed period of time; and collecting and analyzing metal components on a surface of the silicon epitaxial layer following the standing period.

In one embodiment, the prescribed standing period ranges from approximately 12 to approximately 36 hours.

In one embodiment, the collection of metal components is performed with a mixed aqueous solution of hydrofluoric acid, hydrogen peroxide and water.

A feature of the present invention still further relates to a method of evaluating thermal treatment of a wafer, including conducting a test thermal treatment in which a wafer comprising a silicon substrate having an oxygen concentration of approximately equal to or less than $1.0 \times 10^{18}$ atoms/cm$^3$, and a silicon epitaxial layer on at least one surface of the substrate, is heated under the condition of thermal treatment to be evaluated and subsequently cooled; conducting the first analyzing of metal components of an oxide film formed on the wafer during the test thermal treatment by removing the oxide film, and collecting the metal components on a surface of the silicon epitaxial layer; following the collection of metal components, the wafer remains stationary in a standing period for a prescribed period of time; and conducting a second analyzing of metal components on a surface of the silicon epitaxial layer following the standing period.

In one embodiment, the metal components analyzed in the first analyzing step of metal components include nickel, and the metal components analyzed in the second analyzing step of metal components include copper.

A feature of the present invention still further relates to a method of manufacturing a semiconductor wafer, including: subjecting plural semiconductor wafers comprising a wafer for evaluating thermal treatment comprising a silicon substrate having an oxygen concentration of approximately equal to or less than $1.0 \times 10^{18}$ atoms/cm$^3$, and a silicon epitaxial layer on at least one surface of the substrate to thermal treatment in a heating furnace; evaluating presence and/or quantity of metal contamination of the wafer for evaluating thermal treatment following the thermal treatment; and shipping product wafers in the form of those wafers that have been thermally treated in the same heating furnace as the wafer for evaluating thermal treatment when the metal contamination of the wafer for evaluating thermal treatment processes is found to be at or below a target value.

The present invention provides a high-quality semiconductor wafer with reduced metal contamination by permitting evaluation of the contamination in thermal treatment processes with ease and great sensitivity.

Other exemplary embodiments and advantages of the present invention may be ascertained by reviewing the present disclosure and the accompanying drawings.

BRIEF DESCRIPTION OF THE DRAWINGS

The present invention will be described in the following text by the exemplary, non-limiting embodiments shown in the figures, wherein.

DESCRIPTIONS OF THE EMBODIMENTS

Figure 1:
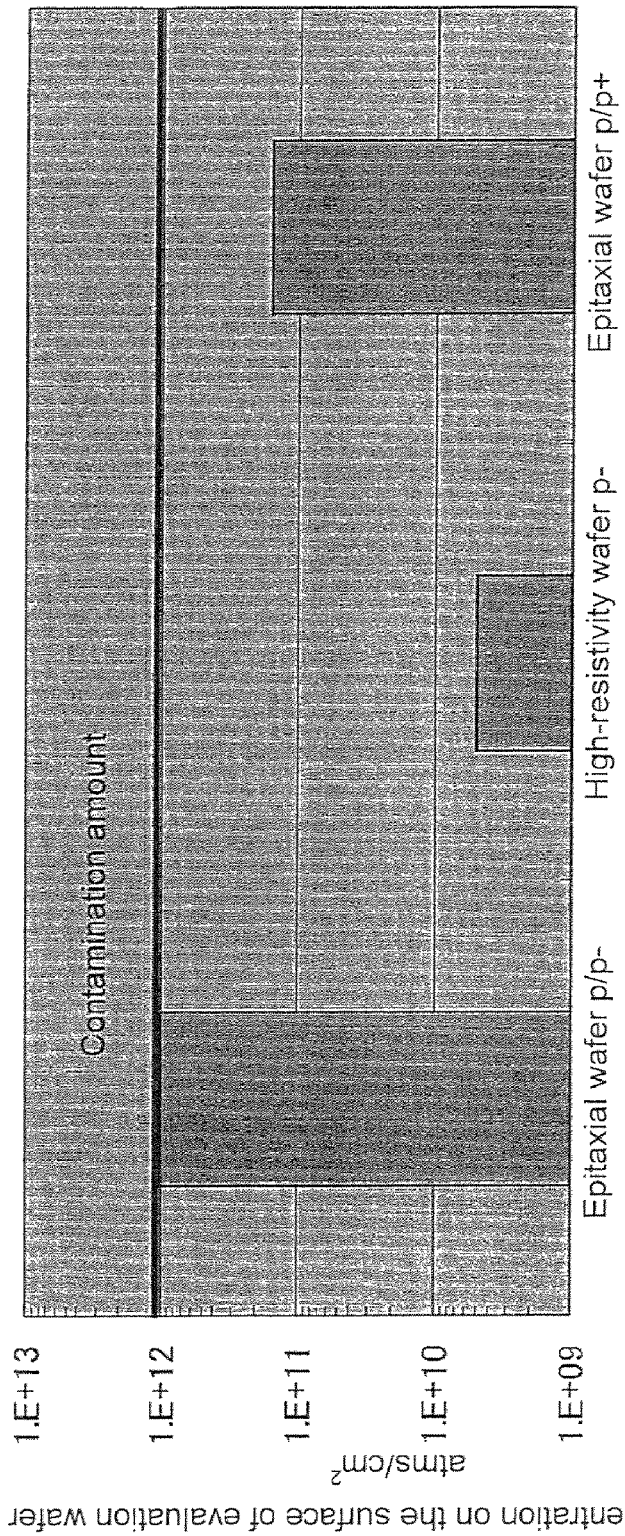
FIG. 1 shows the results of evaluation of the nickel collection rate in Example 1.

The following preferred specific embodiments are, therefore, to be construed as merely illustrative, and not limitative of the remainder of the disclosure in any way whatsoever. In this regard, no attempt is made to show structural details of the present invention in more detail than is necessary for the fundamental understanding of the present invention, the description taken with the drawings making apparent to those skilled in the art how the several forms of the present invention may be embodied in practice.

Wafer for Evaluating Thermal Treatment

The wafer for evaluating thermal treatment employed in the present invention includes a silicon substrate having an oxygen concentration of approximately equal to or less than $1.0 \times 10^{18}$ atoms/cm$^3$ and a silicon epitaxial layer on at least one surface of the substrate. Examples of thermal treatment processes that can be evaluated in the present invention are various thermal treatment processes in the process of manufacturing a semiconductor device, such as oxidation, diffusion, and epitaxial growth. Specific examples of thermal treatment processes that can be evaluated are dopant diffusion processes, epitaxial growth, and $H_2$ annealing.

When a thermal treatment process (heating and cooling) is conducted on the aforementioned wafer for evaluating thermal treatment in a thermal treatment atmosphere, metal impurities present in the atmosphere are typically trapped in the substrate. The wafer for evaluating thermal treatment has a silicon epitaxial layer on the silicon substrate; thus, the wafer warps when a difference in pressure is generated between the substrate and the epitaxial layer. Due to this warping, metal components captured in the substrate during a thermal treatment process are able to diffuse into the epitaxial layer. Further, since the epitaxial layer is a single crystalline layer, metal components are essentially not trapped within the epitaxial layer, but in the end appear at the surface of the epitaxial layer. Based on the aforementioned wafer for evaluating thermal treatment, the metal components on the surface of the epitaxial layer can be collected. It suffices for the aforementioned wafer for evaluating thermal treatment to have a silicon epitaxial layer on at least one side of the silicon substrate.

The oxygen concentration in the above silicon substrate is approximately equal to or less than $1.0 \times 10^{18}$ atoms/cm$^3$. When the oxygen concentration in the silicon substrate exceeds approximately $1.0 \times 10^{18}$ atoms/cm$^3$, oxygen contained in the substrate precipitates out and metal components are gettered by this precipitate, thereby making it difficult for the metal components to diffuse to the epitaxial layer side. Further, the lower limit of the oxygen concentration of the silicon substrate is not specifically limited, but considering the oxygen concentration of common silicon substrate products, can be approximately $0.7 \times 10^{18}$ atoms/cm$^3$, for example. The oxygen concentration of the epitaxial layer is normally lower than the threshold of detection.

In one embodiment, the above silicon substrate and epitaxial layer are desirably doped with boron. Boron exhibits strong interactivity with copper. By doping the silicon substrate with a prescribed amount of boron and keeping the concentration of boron in the epitaxial layer lower than that in the silicon substrate, copper present in the thermal treatment atmosphere can be trapped with high yield in the silicon substrate and diffusion of the copper thus trapped into the epitaxial layer surface can be promoted.

In the case of a boron-doped substrate, in particular, a substrate resistivity that is excessively low (i.e., a high boron concentration) can inhibit the diffusion of copper into the epitaxial layer. Conversely, when the substrate resistivity is excessively high (i.e., a low boron concentration), it can become difficult to trap the copper present in the thermal treatment atmosphere with high efficiency. From these perspectives, the resistivity of the silicon substrate desirably falls within a range of approximately 4 to approximately 20 ohms ($\Omega$)·cm. This makes it possible to trap metal components (particularly copper) present in the thermal treatment atmosphere in the substrate with high efficiency and have them efficiently diffuse into the epitaxial layer. For the same reason, the resistivity of the epitaxial layer desirably falls within a range of approximately 6 to approximately 10 ohms·cm. When the resistivity of the epitaxial layer is kept within the stated ranges, metal components (particularly copper) can be made to diffuse from the substrate into the surface of the epitaxial layer. To cause metal components trapped within the bulk of the substrate to diffuse to the epitaxial layer surface, it is desirable for the substrate to have a higher resistivity than the epitaxial layer; that is, the level of boron doping of the silicon substrate is desirably lower than that of the epitaxial layer.

In one embodiment, to cause metal components trapped in the substrate to efficiently diffuse from the substrate into the surface of the epitaxial layer, the thickness of the epitaxial layer preferably falls within a range of approximately 1 to 10 micrometers, more preferably approximately 3 to approximately 5 micrometers. The thickness of the substrate is not specifically limited; the usual product level (for example, 725 micrometers for a 200 mm wafer, 775 micrometers for a 300 mm wafer) suffices.

In one embodiment, the aforementioned wafer for evaluating thermal treatment can be an epitaxial wafer of p/p$^-$ structure comprised of p-type epitaxial layer formed on a p-type silicon substrate p$^-$. The epitaxial wafer can be manufactured by known methods, such as the method of epitaxially growing a high purity, low-defect layer on a silicon substrate cut from a single silicon crystal grown by the Czochralski method. The usual methods of forming an epitaxial layer on the substrate may be employed, such as the method of epitaxially growing a layer of desired thickness by CVD (Chemical Vapor Deposition) method using a silicon-containing starting gas such as, for example, $SiCl_4$, $SiHCl_3$, or $SiH_2Cl_2$.

In one embodiment, the surface of the silicon substrate upon which the epitaxial layer resides is desirably a mirror-polished surface. When the epitaxial layer is grown on a mirror-polished surface of the silicon substrate, high-precision evaluation can be conducted without gettering metals at the boundary. Known methods may be employed for mirror polishing.

The aforementioned wafer for evaluating thermal treatment can be employed to evaluate the presence and/or quantity of metal contaminants (such as contamination by metal impurities present in a heating furnace) in thermal treatment processes in the process of manufacturing a semiconductor wafer. Nickel and copper are examples of metal impurities that can be evaluated by the wafer for evaluating thermal treatment mentioned above. The aforementioned wafer for evaluating thermal treatment is particularly suitable for analyzing metals, such as nickel and copper, that are difficult to evaluate by the SPV and lifetime methods.

Method of Evaluating Thermal Treatment

The first method of evaluating thermal treatment of the present invention (referred to Method I, hereinafter) includes:
    conducting a test thermal treatment in which a wafer comprising a silicon substrate having an oxygen concentration of approximately equal to or less than $1.0 \times 10^{18}$ atoms/cm$^3$, and a silicon epitaxial layer on at least one surface of the substrate, is heated under the condition of thermal treatment to be evaluated and subsequently cooled; and
    collecting and analyzing metal components on a surface of the silicon epitaxial layer following the above test thermal treatment.

In Method I, the wafer for evaluating thermal treatment mentioned above can be employed. In Method I, the thermal treatment that is to be evaluated is tested in a test thermal treatment. This permits highly precise quantification and evaluation of metal impurities that contaminate the interior of substrates during the thermal treatment that is being evaluated.

Since Method I is suited to the analysis of nickel, an example of the analysis of nickel as a metal impurity will be used below to describe Method I. However, the metal impurity analyzed by the method of the present invention is not limited to nickel.

In the test thermal treatment, nickel is caused to diffuse into the interior of the substrate bulk by heating, after which it is diffused to the epitaxial layer side and gettered into the surface of the epitaxial layer by cooling. The nickel that has been gettered into the surface of the epitaxial layer can be readily collected by running a collection solution over the surface of the epitaxial layer. Thus, since the nickel is not trapped within the substrate or epitaxial layer, but appears at the surface of the epitaxial layer in Method I, it can be collected without dissolving the substrate or epitaxial layer.

In one embodiment, an acidic solution can be employed, for example, to collect the metal components that have been gettered into the surface of the epitaxial layer. An example of the acidic solution is a mixed solution of hydrofluoric acid, hydrogen peroxide aqueous solution, and water. Specifically, a mixed solution of 2 weight percent hydrofluoric acid, 2 weight percent hydrogen peroxide aqueous solution, and water may be employed. A weakly acidic solution such as the above can be run over the surface of the evaluation wafer mentioned above to readily collect metal components.

The metal components that are collected in the collection solution can be analyzed by the various analysis methods commonly employed to quantify metal components in solutions. Examples of such methods are Atomic Absorption Spectrometry (AAS) and Inductively Coupled Plasma Mass Spectrometry (ICP-MS).

The AAS method, particularly Graphite Furnace AAS (GF-AAS) method, is widely employed because the device is simple and easy to operate. In the GF-AAS method, the sample solution can be charged to a graphite electric furnace, the solvent is distilled off at relatively low temperature, and the sample is typically heated to 2,000 to 2,800 degrees Celsius to atomize the metal elements. Subsequently, the atomized metals can be quantified by measuring the unique absorption ratio of each element for light irradiated from an outside light source. Normally, a halogen cathode lamp is typically employed as the light source. The light source must be changed for each element being measured, but the GF-AAS method permits an analysis sensitivity of concentrations of several tens of ppt (pg/mL) in the sample solution. During absorption measurement, a magnetic field can be applied and the Zeeman effect utilized for background compensation, further enhancing detection sensitivity.

In the ICP-MS method, the sample solution is vaporized or converted to an aerosol in a nebulizer and then introduced into an argon plasma by means of high-frequency electric power applied with an inductively coupled coil. The sample is typically heated to about 6,000 to 7,000 K in the plasma at atmospheric pressure to atomize the individual elements, and then ionized at an efficiency of approximately 90 percent or greater. The ions pass through a skimmer (interface). The energy is typically collimated by an ion lens element, introduced into a mass spectrometer maintained at a high level of vacuum of approximately less than $10^{-6}$ Pa, and subjected to mass spectrometry. The metal components in the solution can thus be quantified. The ICP-MS method can be used to analyze trace metal components with high sensitivity. However, the analysis of strong acid solutions is difficult by the ICP-MS method. However, since metal components can be collected with a weak acid in the present invention, metal components can be readily analyzed by the ICP-MS method.

When a thermal treatment is conducted in an oxygen atmosphere, a thick oxide film usually forms on the wafer surface. Further, even when a thermal treatment is conducted in a non-oxidizing atmosphere, the entrainment of oxygen into the heating furnace during the introduction of the wafer can cause the formation of an oxide film of about 30 to 40 angstroms on the wafer surface. Even in Method I, an oxide film normally forms on the surface of the epitaxial layer after the test thermal treatment, and nickel dispersed on the surface of the epitaxial layer is present beneath this surface oxide film. Accordingly, nickel is desirably collected from the surface of the epitaxial layer after removing the surface oxide film. The surface oxide film can be removed by a method such as vapor phase decomposition.

The second method of evaluating thermal treatment of the present invention (referred to Method II, hereinafter) includes:

conducting a test thermal treatment in which a wafer comprising a silicon substrate having an oxygen concentration of approximately equal to or less than $1.0 \times 10^{18}$ atoms/cm$^3$ and a silicon epitaxial layer on at least one surface of the substrate is heated under the condition of thermal treatment to be evaluated and subsequently cooled;

removing an oxide film that has been formed during the above test thermal treatment;

leaving the wafer following the removing of the oxide film to stand for a prescribed period; and collecting and analyzing metal components on a surface of the silicon epitaxial layer following the above leaving.

In Method II, the wafer for evaluating thermal treatment mentioned above can be employed. Method II is a particularly suitable method for the analysis of copper as a metal component. As set forth above, an oxide film normally forms on the wafer surface when conducting the test thermal treatment. The copper that is trapped within the substrate in the test thermal treatment has the property of not diffusing into the wafer surface in wafers on which a surface oxide film is present, but will gradually diffuse into the wafer surface once the surface oxide film has been removed. This property can be utilized in Method II: after removing the oxide film from the wafer surface following the test thermal treatment, the wafer can be left to stand for a prescribed period to cause the copper that has been trapped within the substrate from the thermal treatment atmosphere during the test thermal treatment to diffuse into the surface of the epitaxial layer. The copper that has been gettered into the surface of the epitaxial layer in this manner can then be readily collected by running a collection solution over the surface of the epitaxial layer. In this manner, copper that is difficult to evaluate by the SPV and lifetime methods can typically be analyzed by Method II.

The period that the wafer is left to stand after removal of the above-described oxide film is desirably established based on the physical properties of the wafer (such as thickness, resistivity and the like), the degree of contamination of the thermal treatment atmosphere, and the like. This permits the copper within the substrate bulk to be colleted with high efficiency from the surface of the epitaxial layer. The standing period is desirably set to approximately 12 to approximately 36 hours. The temperature of the atmosphere in which the wafer is left to stand following removal of the surface oxide film is desirably from approximately 20 to approximately 25 degrees Celsius. The standing atmosphere is not specifically limited; however, the wafer is desirably stored in a clean room following removal of the oxide film to prevent contamination.

Details of the other steps in Method II are as described for Method I above.

The third method of evaluating thermal treatment of the present invention (referred to Method III, hereinafter) includes:

conducting a test thermal treatment in which a wafer comprising a silicon substrate having an oxygen concentration of approximately equal to or less than $1.0 \times 10^{18}$ atoms/cm$^3$ and a silicon epitaxial layer on at least one surface of the substrate is heated under the condition of thermal treatment to be evaluated and subsequently cooled;

conducting the first analyzing step in which an oxide film that has been formed during the above test thermal treatment is removed, and then metal components on a surface of the silicon epitaxial layer are collected and analyzed;

leaving the wafer following the collection of metal components to stand for a prescribed period; and conducting the second analyzing step in which metal components on a surface of the silicon epitaxial layer following the above leaving are collected and analyzed.

In Method III, the wafer for evaluating thermal treatment mentioned above can be employed. In Method III, metal components (such as nickel) that have appeared on the surface of the epitaxial layer following the test thermal treatment are collected and analyzed. Next, following removal of the oxide film, metal components (such as copper) that have appeared in the surface of the epitaxial layer are collected and analyzed. Based on this method, metal components, such as nickel, appearing at the surface of the epitaxial layer following the test thermal treatment, and copper that appears at the surface of the epitaxial layer following the removal of the oxide film, can be sequentially analyzed. The details of the various steps in Method III are identical to those described in Methods I and II.

Based on Methods I, II, and III as set forth above, the presence and/or concentration of metal contamination in thermal treatment processes conducted in the process of manufacturing a semiconductor wafer can be conveniently analyzed with high precision. Based on the evaluation results obtained, the structure of the heating furnace employed for thermal treatment can be altered and various means for reducing contamination can be adopted, such as more vigorous washing, to provide a high-quality wafer receiving less metal contamination during thermal treatment.

Method of Manufacturing Semiconductor Wafer

The method of manufacturing a semiconductor wafer of the present invention includes:

subjecting plural semiconductor wafers comprising a wafer for evaluating thermal treatment comprising a silicon substrate having an oxygen concentration of approximately equal to or less than $1.0 \times 10^{18}$ atoms/cm$^3$ and a silicon epitaxial layer on at least one surface of the substrate to thermal treatment in a heating furnace;

evaluating presence and/or quantity of metal contamination of the wafer for evaluating thermal treatment following the thermal treatment; and shipping product wafers in the form of those wafers that have been thermally treated in the same heating furnace as the wafer for evaluating thermal treatment when the metal contamination of the wafer for evaluating thermal treatment processes is found to be at or below a target value.

The method of evaluating thermal treatment of the present invention permits the convenient evaluation with high precision of metal contaminants in thermal treatment processes through the analysis of metal components, such as nickel and copper, that contaminate the wafer from the thermal treatment atmosphere. The method of manufacturing semiconductor wafers of the present invention can provide high-quality semiconductor wafers with high reliability by permitting the shipment of product wafers whose metal contamination due to thermal treatment has been evaluated and confirmed in the actual manufacturing process. For example, one wafer for evaluation is desirably employed per day for each thermal treatment furnace. Further, since convenient evaluation can be conducted with high precision according to the present invention, a single wafer for evaluation can be employed for each thermal treatment cycle to conduct evaluation and obtain highly reliable evaluation results.

The above target value can be set in consideration of the physical properties required of the wafer based on the wafer application and the like. Examples of the thermal treatment are various thermal treatment processes such as oxidation, diffusion, and epitaxial growth in the process of manufacturing a semiconductor device. Specific examples are dopant diffusion processes, epitaxial growth, and $H_2$ annealing.

EXAMPLES

The present invention will be described in detail below based on examples. However, the present invention is not limited to the examples.

Example 1

Manufacturing of a Wafer for Evaluating Thermal Treatment

A boron-doped epitaxial layer (thickness: 3 micrometers; resistivity: 6 ohms·cm) was deposited on a boron-doped silicon substrate (oxygen concentration: $1.0 \times 10^{18}$ atoms/cm$^3$ (ASTM F-121 1979), resistivity: 4 ohms·cm) to prepare an epitaxial wafer (p/p$^-$) for evaluation of thermal treatment.

Evaluation of Nickel Collection Rate

The above wafer was contaminated to a known nickel contamination level of $1 \times 10^{12}$ atoms/cm$^2$ and heat treated to remove the surface oxide film. Subsequently, the nickel on the surface of the wafer was collected with an acidic collection solution (HF (2 weight percent)/$H_2O_2$ (2 weight percent)/$H_2O$) and quantitatively analyzed by ICP-MS. Collection of the surface oxide film was conducted in the same manner as in Example 2 mentioned below.

As a comparative sample, the same treatment was conducted with a high-resistivity wafer (p$^-$) and an epitaxial wafer (p/p$^+$) having a substrate with low resistivity. The results are given in FIG. 1.

As shown in FIG. 1, the epitaxial wafer of Example 1 permitted quantitative evaluation of nickel at a high collection rate. Conversely, in the (highly doped) epitaxial wafer with a substrate of low-resistivity, the collection rate was low because the nickel remained within the bulk of the substrate, scarcely diffusing into the surface of the epitaxial layer. In the high resistivity wafer, although the nickel diffused into the wafer surface during the cooling process in the thermal treatment, nickel silicide is thought to have formed just beneath the surface of the wafer, preventing collection with a weak acid.

Evaluation of the Copper Collection Rate

The surfaces of wafers for the evaluation of thermal treatment identical to that described above were contaminated to a known copper contamination level of $1 \times 10^{12}$ atoms/cm$^2$ and the wafers were heat treated. The copper on the surfaces of the wafers was collected with an acidic recovery solution (HF (2 weight percent), $H_2O_2$ (2 weight percent), and $H_2O$), either immediately following removal of the surface oxide film or after standing for one day at room temperature following removal of the surface oxide film, and quantitatively analyzed by ICP-MS. The surface oxide film was removed in the same manner as in Example 2.

As a comparative sample, the above-described two types of wafers were subjected to the same treatment. The results are given in FIG. 2.

Figure 2:
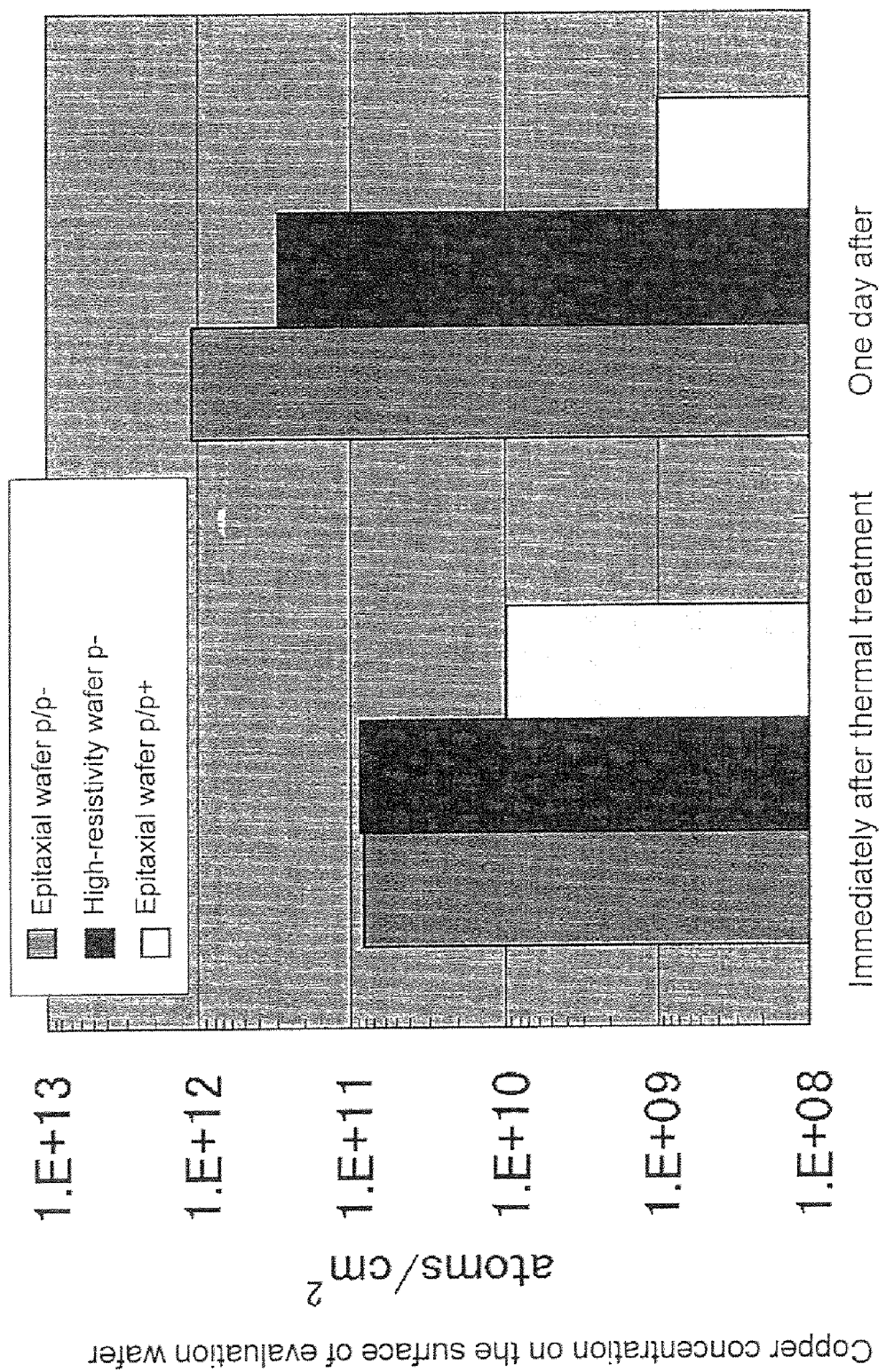
FIG. 2 shows the results of evaluation of the copper collection rate in Example 1.

As shown in FIG. 2, the copper collection rates immediately after removal of the oxide film were low in both of the wafers. However, in the epitaxial wafer of Example 1, it was possible to collect copper at a high collection rate from the surface of the epitaxial layer after the wafer had been left standing for one day. By contrast, the copper collection rate was low even after standing for one day in the comparative sample. These results clearly indicated that the epitaxial wafer (p/p$^-$) of Example 1 permitted the quantitative evaluation of copper at a high collection rate after the wafer had stood for one day following the thermal treatment process.

Example 2

Evaluation of Thermal Treatment Processes (1) Analysis of Nickel

A boron-doped epitaxial layer (thickness: 3 micrometers; resistivity: 6 ohms·cm) was deposited on a boron-doped silicon substrate (oxygen concentration: $1.0 \times 10^{18}$ atoms/cm$^3$ (ASTM F-121 1979), resistivity: 4 ohms·cm) to prepare epitaxial wafers (p/p$^-$) for evaluation of thermal treatment.

The above-described wafers for evaluation of thermal treatment were thermally treated under nitrogen atmospheres under one of the four conditions of 1 hour at 900 degrees Celsius, 10 hours at 900 degrees Celsius, 1 hour at 1,100 degrees Celsius, and 10 hours at 1,100 degrees Celsius in a heating furnace 1 employing a board treated with a CVD coating of SiC and a heating furnace 2 employing a board that had not been treated with a CVD coating of SiC.

Following thermal treatment, a hydrofluoric acid solution was introduced into a sealed container to remove the surface oxide films on the thermally treated wafers by vapor phase decomposition. The thermally treated wafers were charged without contamination into the container filled with hydrofluoric acid vapor and left there for about one minute to decompose the surface oxide film.

A 1,000 mL quantity of a mixed solution of HF (2 weight percent), $H_2O_2$ (2 weight percent), and $H_2O$ was directly dripped onto wafers from which the surface oxide films had been removed. The droplets were run across the entire surface of the wafers to collect the metal components on the surface. Metal components were also similarly collected from the rear surface of the wafers. The collection solution was quantitatively analyzed by ICP-MS.

(2) Copper Analysis

Next, to evaluate the copper contamination caused by thermal treatment, the wafers from which the nickel had been collected were left standing at room temperature for one day. A 1,000 mL quantity of a mixed solution of HF (2 weight percent), $H_2O_2$ (2 weight percent), and $H_2O$ was directly dripped onto the surface of the wafers that had been standing for one day. The droplets were run across the entire surface of the wafers to collect the copper impurities on the surface. Copper impurities were also similarly collected from the rear surface of the wafers. These collection solutions were quantitatively analyzed by ICP-MS.

The results are given in Table 1, shown below. Table 1 reveals that in heating furnace 1, in which a wafer that had been CVD coated with SiC was employed, there was little nickel or copper contamination. In heating furnace 2, in which a wafer that had not been CVD coated with SiC was employed, there were higher levels of nickel and copper contamination than in heating furnace 1.

These results indicate that the source of contamination by nickel and copper was the wafer that had not been CVD coated with SiC. Replacing the wafer that had not been CVD coated with SiC with one that had been CVD coated with SiC reduced the nickel and copper contamination in the heating process. In this manner, the present invention permits quantitative evaluation of nickel and copper in the thermal treatment, making it possible to improve the thermal treatment process based on the evaluation results.

TABLE 1

|  |  | 900° C. 1 hr | 900° C. 10 hrs | 1100° C. 1 hr | unit: atoms/cm$^2$ 1100° C. 10 hrs |
|---|---|---|---|---|---|
| Heating furnace 1 | Ni | <1.0E+08 | <1.0E+08 | <1.0E+08 | 5.2E+08 |
|  | Cu | <1.0E+08 | <1.0E+08 | <1.0E+08 | 8.8E+08 |
| Heating furnace 2 | Ni | 2.5E+08 | 6.7E+08 | 3.1E+10 | 5.3E+11 |
|  | Cu | 2.6E+08 | 2.6E+09 | 7.3E+10 | 1.4E+12 |

The present invention makes it possible to provide high-quality semiconductor wafers with reduced metal contamination.

Although the present invention has been described in considerable detail with regard to certain versions thereof, other versions are possible, and alterations, permutations and equivalents of the version shown will become apparent to those skilled in the art upon a reading of the specification and study of the drawings. Also, the various features of the versions herein can be combined in various ways to provide additional versions of the present invention. Furthermore, certain terminology has been used for the purposes of descriptive clarity, and not to limit the present invention. Therefore, any appended claims should not be limited to the description of the preferred versions contained herein and should include all such alterations, permutations, and equivalents as fall within the true spirit and scope of the present invention.

Having now fully described this invention, it will be understood to those of ordinary skill in the art that the methods of the present invention can be carried out with a wide and equivalent range of conditions, formulations, and other parameters without departing from the scope of the invention or any embodiments thereof.

Further, when an amount, concentration, or other value or parameter, is given as a list of upper preferable values and lower preferable values, this is to be understood as specifically disclosing all ranges formed from any pair of an upper preferred value and a lower preferred value, regardless whether ranges are separately disclosed.

All patents and publications cited herein are hereby fully incorporated by reference in their entirety. The citation of any publication is for its disclosure prior to the filing date and should not be construed as an admission that such publication is prior art or that the present invention is not entitled to antedate such publication by virtue of prior invention.

What is claimed is:

1. A method of evaluating thermal treatment of a wafer, comprising:
    conducting a test thermal treatment in which a wafer comprising a silicon substrate having an oxygen concentration of approximately equal to or less than $1.0 \times 10^{18}$ atoms/cm$^3$, and a silicon epitaxial layer on at least one surface of the substrate, is heated under the condition of thermal treatment to be evaluated and subsequently cooled;
    conducting a first analyzing of metal components of an oxide film formed on the wafer during the test thermal treatment by removing the oxide film, and collecting the metal components on a surface of the silicon epitaxial layer;
    following the collection of metal components, the wafer remains stationary in a standing period for a prescribed period of time; and
    conducting a second analyzing of metal components on a surface of the silicon epitaxial layer following the standing period.

2. The method of evaluating of claim 1, wherein the metal components analyzed in the first analyzing of metal components comprise nickel, and the metal components analyzed in the second analyzing of metal components comprise copper.

3. The method of evaluating thermal treatment of claim 1, wherein the prescribed period ranges from approximately 12 to approximately 36 hours.

4. The method of evaluating thermal treatment of claim 1, wherein said collection of metal components is performed with a mixed aqueous solution of hydrofluoric acid, hydrogen peroxide, and water.

5. The method of evaluating thermal treatment of claim 1, wherein the silicon epitaxial layer has a thickness ranging from approximately 1 to approximately 10 micrometers.

6. The method of evaluating thermal treatment of claim 1, wherein the silicon substrate has a resistivity ranging from approximately 4 to approximately 20 ohms·cm.

7. The method of evaluating thermal treatment of claim 1, wherein the silicon epitaxial layer has a resistivity ranging from approximately 6 to approximately 10 ohms·cm.

8. The method of evaluating thermal treatment of claim 1, wherein the silicon substrate has a resistivity higher than that of the silicon epitaxial layer.

9. The method of evaluating thermal treatment of claim 1, wherein boron is doped in the silicon substrate and the silicon epitaxial layer.

10. The method of evaluating thermal treatment of claim 1, wherein the silicon substrate has a surface that has been mirror-polished and has the silicon epitaxial layer on the mirror-polished surface.

11. The method of evaluating thermal treatment of claim 1, wherein the evaluation is the evaluation of presence and/or quantity of metal contamination during thermal treatment in the process of manufacturing a semiconductor wafer.

\* \* \* \* \*